United States Patent [19]
Grodstein et al.

[11] Patent Number: 5,648,911
[45] Date of Patent: Jul. 15, 1997

[54] METHOD OF MINIMIZING AREA FOR FANOUT CHAINS IN HIGH-SPEED NETWORKS

[76] Inventors: Joel Joseph Grodstein, 118 Rhinecliff St., Arlington, Mass. 02174; Kolar L. Kodandapani, 2 Adin Dr., Shrewsbury, Mass. 01545; Hervé Touati, 59 A Avenue de Colmar, 92500 Rueil-Malmaison, France

[21] Appl. No.: 707,042

[22] Filed: Aug. 30, 1996

Related U.S. Application Data

[63] Continuation of Ser. No. 171,075, Dec. 21, 1993, abandoned.

[51] Int. Cl.$^6$ .................................................. H03K 19/20
[52] U.S. Cl. ........................................................ 364/490
[58] Field of Search ........................... 364/488, 489, 364/490, 491, 578; 395/500

[56] References Cited

U.S. PATENT DOCUMENTS

| | | | |
|---|---|---|---|
| 4,625,127 | 11/1986 | Lee et al. | 307/270 |
| 4,882,698 | 11/1989 | Young | 364/736 |
| 5,043,914 | 8/1991 | Nishiyama et al. | 364/513 |
| 5,218,551 | 6/1993 | Agrawal et al. | 364/491 |
| 5,245,549 | 9/1993 | Shoji et al. | 364/489 |
| 5,317,601 | 5/1994 | Riordan et al. | 375/107 |

OTHER PUBLICATIONS

Chaudhary, Kamal et al, *A Near Optimal Algorithm for Technology Mapping Minimizing Area Under Delay Constraints*; 29th ACM/IEEE Design Automation Conference, IEEE Computer Society Press, paper 30.4, Jun. 1992, pp. 492–498.

Detjeus, Ewald, et al., *Technology Mapping in MIS*, IEEE International Conference on Computer–Aided Design (ICCAD–87), Computer Society Press of IEEE, 1987, pp. 116–119.

Fishburn, John P., *LATTIS: An Iterative Speedup Heuristic for Mapped Logic*, 29th ACM/IEEE Design Automation Conference, IEEE Computer Society Press, paper 30.3, pp. 488–491.

Kodandapani, K. et al, *A Simple Algorithm for Fanout Optimization using High–Performance Buffer Libraries*, presented Nov. 8th at International Conference of Computer Aided Design (ICCAD–93), California, 1993, pp. 1–6.

Sapatnekar, Sachin Suresh, *A Convex Programming Approach to Problems in VLSI Design*, University of Illinois at Urbana–Champain, Ph. D. Thesis, 1992, pp. 1–169.

Touati, Herve' J., *Performance–Oriented Technology Mapping*, University of California, Berkeley, Ph. D. Thesis, 1990, pp. 1–139.

Lin et al., "A Fast and Efficient Algorithm for Determining Fanout Trees in Large Networks", European Design Automation Conference, 1991, pp. 539–544.

Lioy, "On the Equivalence of Fanout–Point Faults", IEEE Transactions on Computers, Mar. 1993, pp. 268–271.

Gupta et al., "Timing Optimizations in a High–Level Synthesis System", Custom Integrated Circuits Conference, 1990, pp. 14.1.1–14.1.4.

(List continued on next page.)

*Primary Examiner*—Kevin J. Teska
*Assistant Examiner*—Stephen J. Walder, Jr.
*Attorney, Agent, or Firm*—Diane C. Drozenski; Denis G. Maloney; Arthur W. Fisher

[57] ABSTRACT

The method for efficiently providing an optimized fanout network includes the steps of providing a series chain of inverters for driving a number of loads. Each load is assigned to a given location of the inverter chain according to the polarity and the required time of the load. Tree-covering techniques are used in conjunction with dynamic programming to minimize the total area of the fanout chain by selecting and sizing the gates to be used in the fanout chain. With such an arrangement, a minimal area fanout chain which satisfies the timing constraints of each load is provided.

5 Claims, 4 Drawing Sheets

OTHER PUBLICATIONS

Min et al., "FanHat: Fanout Oriented Hierarchical Automatic Test Generation System", University of Texas at Austin, 1989, pp. 470–473.

Fishburn, "LATTIS: An Iterative Speedup Heuristic for Mapped Logic", Design Automation Conference, 1992, pp. 488 491.

Cong, "An Improved Graph–Based FPGA Technology Mapping Algorithm for Delay Optimization", Computer Design ICCD '92, 1992, pp. 154–158.

Singh et al., "A Heuristic Algorithm for the Fanout Problem", Design Automation Conference, 1990, pp. 357–360.

Chaudhary, "A Near Optimal Algorithm for Technology Mapping Minimizing Area under Delay Constraints", Design Automation Conference, 1992, pp. 492–498.

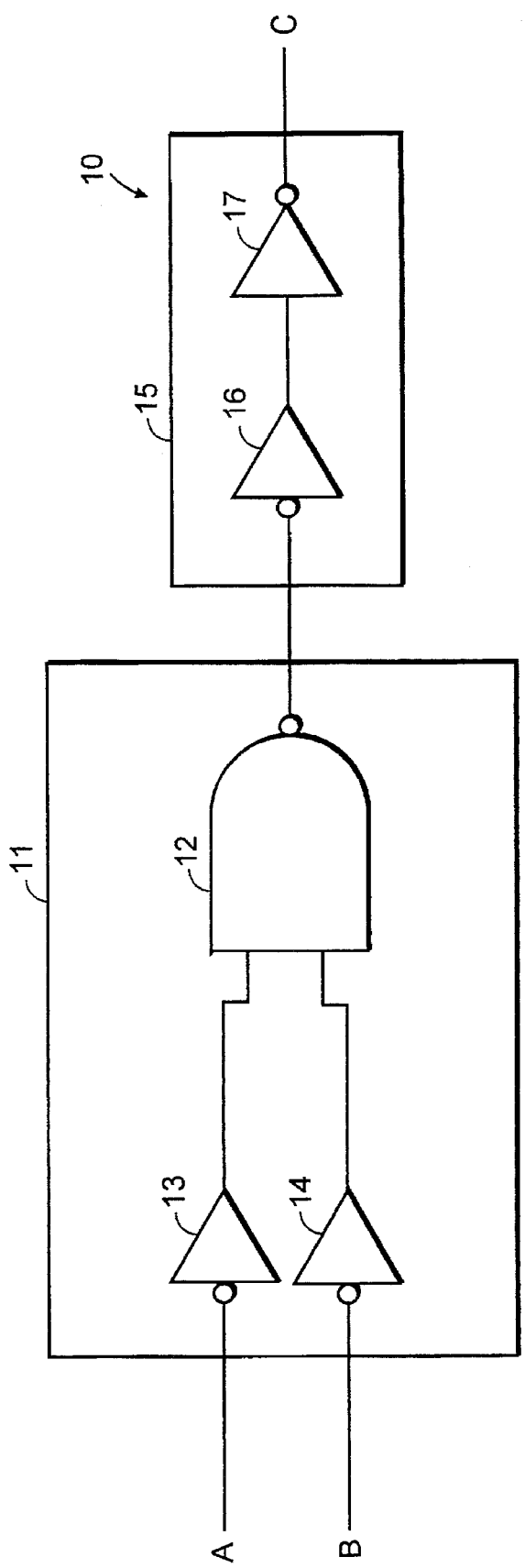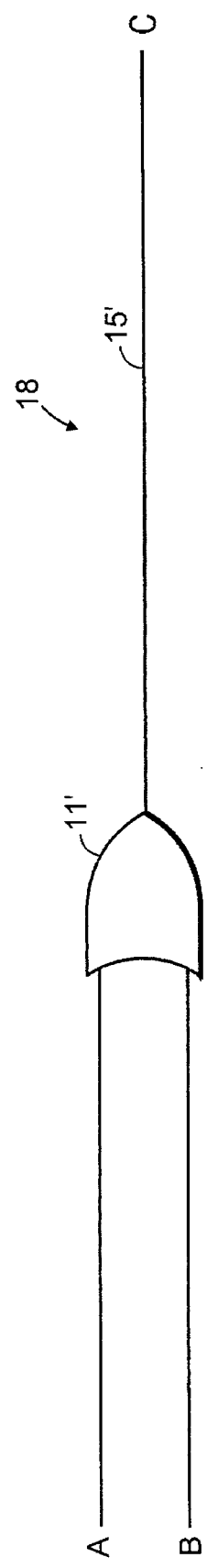
FIG. 1A
FIG. 1B

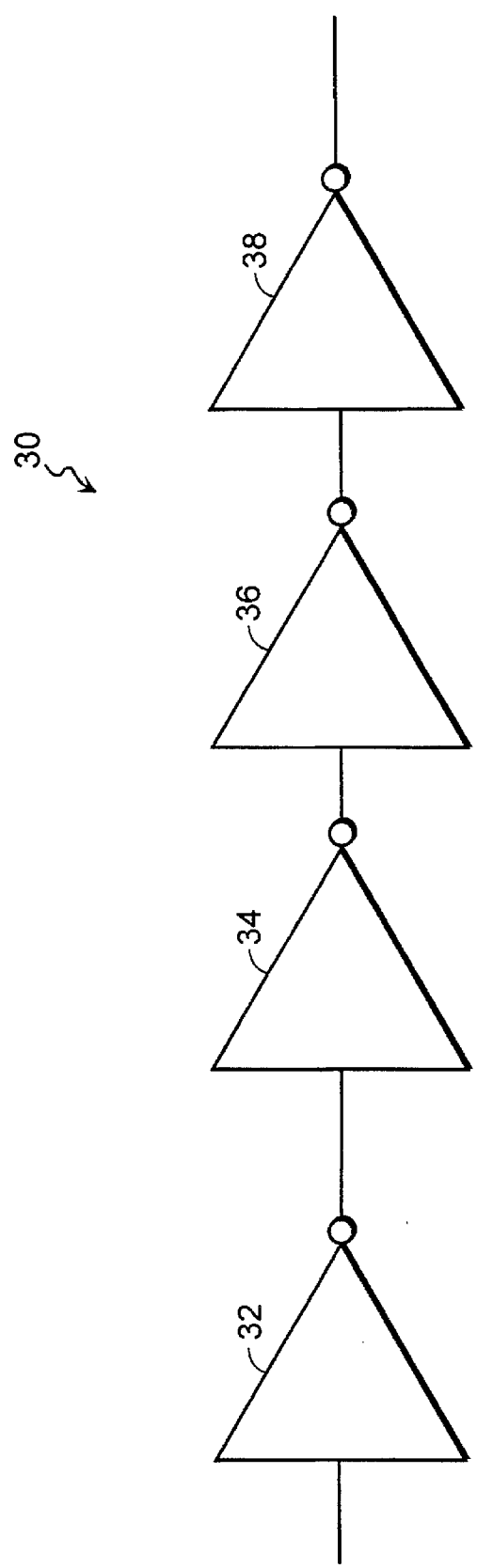

METHOD OF MINIMIZING AREA FOR FANOUT CHAINS IN HIGH-SPEED NETWORKS

This application is a continuation of application Ser. No. 08/171,075, filed Dec. 21, 1993 now abandoned.

FIELD OF THE INVENTION

This invention relates generally to the design of integrated circuits and more specifically to integrated circuit design using logic synthesis techniques.

BACKGROUND OF THE INVENTION

As it is known in the art, integrated circuits may be designed manually or with the use of logic synthesis tools. Logic synthesis tools are rule based or algorithmic processes that are used to translate boolean logic equations into circuit schematics.

One benefit of using logic synthesis for integrated circuit design is that a synthesized design can be done more rapidly than a manual design. One drawback of using logic synthesis is that the quality of the synthesized design is often inferior to that of a manually generated design in terms of circuit delay and area. Thus logic synthesis tools are generally used for designs that do not have strict timing or area constraints.

One case where synthesized logic is inferior to manually designed logic is fanout networks. Fanout networks are used when one gate must drive many loads but does not have the current capacity to drive the loads within the required times. A fanout network problem generally includes the following elements: a driving gate, having a known drive capability and input signal arrival time, a number of loads to be driven by the driving gate, each load having known capacitive load values and required input signal arrival times, and an available library of buffers of varying sizes and timing characteristics which can be used to drive the loads. A solution to the fanout problem comprises one or more buffers inserted in a certain configuration between the driving gate and the loads to provide the current capacity necessary for driving the loads in the required times. The fanout network should be optimized to use a minimal area for the distribution of signals while respecting the timing constraints. If all timing constraints cannot be met, a network is provided that exceeds the delay constraints by the smallest amount.

Fanout networks also help to reduce the propagation delay through a gate by reducing the gate's capacitive load. For example, if the output of a gate is coupled to n loads, the delay through the gate is O(n). By building a simple buffer tree at the output of the gate, the delay is reduced to O(log n).

Certain signals in the design may have critical timing constraints which, if not met, will cause the circuit to malfunction. A net on which a critical signal propagates is herein defined as a critical net, and a load receiving its input on a critical net is herein defined as a critical load. However, not all nets are critical, and each load driven by a gate generally has a distinct timing constraint. Ideally, a fanout network should be designed to provide the signal to the loads exactly when required. Loads with less restrictive timing constraints would be driven by latter portions of the fanout network, and thus all loads would be equally critical.

Fundamental fanout optimization techniques include buffer resizing and critical net isolation. Buffer resizing is a technique where the sizes of the transistors of the driving buffers are modified in order to meet the delay constraints for given output loads at a minimum cost in area. For example, the transistor size of a buffer driving a critical net may be increased to provide a faster drive to satisfy the timing constraint of an attached load. Similarly, the transistor size of a buffer driving a less critical net may be reduced to a size which keeps the timing constraint satisfied while reducing the area used for the fanout network.

Critical net isolation is used in fanout networks to provide the smallest number of buffers between the source and the critical load. A fanout network designed using critical net isolation may comprise two levels of buffering, where the first level includes one buffer for driving both the critical net and the second level of the fanout network. Because the critical net is driven by an earlier buffer stage, the propagation delay to the critical load is minimized.

Most existing methods for synthesizing fanout networks use the capacitive load and timing constraint information of each load to build iteratively a variety of buffer networks. Each buffer network is analyzed for area consumption and propagation delay. The results are compared against the best solution obtained so far, and discarded if the new configuration is not an improvement. The process described above is computationally intensive. The search space is limited by the amount of time deemed reasonable to allocate to fanout optimization within the entire design process. Due to the many sizes of buffers available for a fanout network design, and the many different ways to interconnect the buffers to drive the loads, finding an optimal fanout network by exhaustive search is unpractical for all but the simplest fanout problems.

One fanout optimization technique that restricts a priori the search space is the LT-tree method, described in "Performance-Oriented Technology Mapping", by Hervé Touati, PhD Thesis, U. C. Berkeley, 1990. The LT-tree method considers only a subset of the set of all possible fanout tree networks and computes the fastest circuit within that subset. This subset is small enough to be searched exhaustively and still large enough to allow the buffering of loads while performing critical net isolation. A type 1 LT-Tree includes a chain of fanout buffers, each of which drives no more than one fanout buffer. A type 2 LT-tree also includes a chain of fanout buffers, with the last buffer in the chain potentially driving more than one buffer, wherein the buffers which are driven by the last buffer in the chain do not drive any other buffer.

A drawback of the methods described above for providing optimized fanout networks is that the size of the fanout network which is generated tends to be unnecessarily large. This is because the primary purpose of the methods described above is to minimize delay. Area minimization is performed as a secondary task. Large fanout networks are undesirable because the area used for the fanout network could alternatively be used to increase the logical function of the integrated circuits.

SUMMARY OF THE INVENTION

In accordance with the present invention, a method for designing a network to drive a group of loads includes the steps of providing a plurality of series coupled inverters, assigning each load to be coupled to an output of one of the inverters, and mapping each of the inverters to a given gate in a library of gates. With such arrangement a computationally efficient method for designing an optimized fanout network is provided, because a single fanout network topology is used during the search for an optimized fanout network.

In accordance with a further aspect of the invention, the method of coupling each load to the output of an inverter further includes the steps of ordering the loads in order of increasing required times, determining the signal polarity of each load, and assigning each of the loads to one of the coupled inverters which drives the appropriate signal polarity. Such an arrangement provides a computationally efficient method for efficiently generating fanout networks both in terms of circuit delay and circuit area. In addition, a straightforward decision mechanism for load placement facilitates the design process and decreases the amount of time necessary for network computation.

BRIEF DESCRIPTION OF THE DRAWINGS

FIG. 1A illustrates a typical boolean logic circuit;

FIG. 1B illustrates the boolean logic circuit of FIG. 1A after a tree covering process has been performed;

FIG. 2 illustrates a series chain of inverters;

DETAILED DESCRIPTION OF THE PREFERRED EMBODIMENT

Figure 3A:
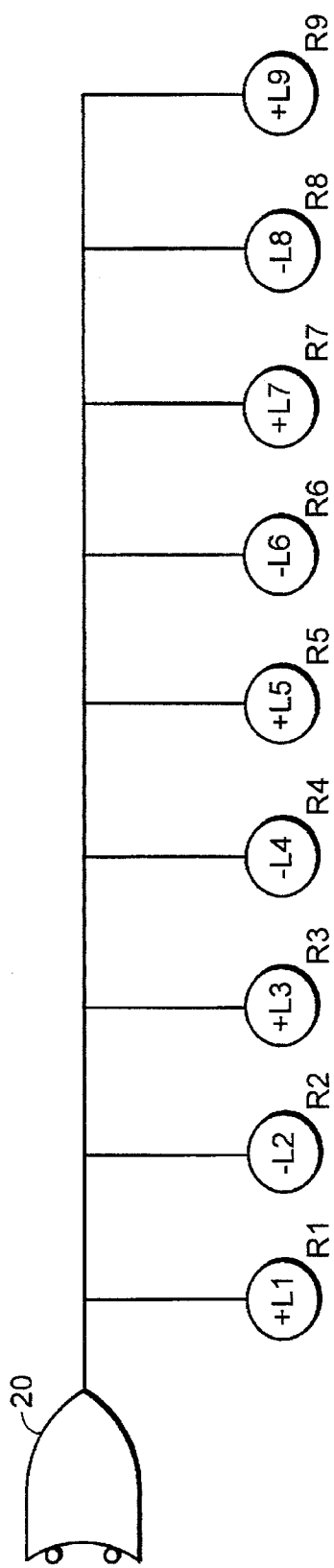
FIG. 3A illustrates a series of loads driven by the circuit of FIGS. 1, 2, and 3.

Referring now to FIGS. 1A and 1B, a method of logic synthesis used in the preferred embodiment of the invention to provide an optimized fanout network is described.

Given a library of gates and a boolean logic function, there are numerous circuit configurations which would implement the given logical function. Logic synthesis tools are commonly used to provide an optimized circuit using a given library of gates. The goal of logic synthesis tools is typically to provide a circuit having the smallest area while meeting all delay constraints.

Logic synthesis design generally comprises two basic design processes. The first process provides a technology independent boolean network given as input a boolean function. The second process, referred to as technology mapping, consists of implementing the boolean network using gates from a given library.

One method of technology mapping is "tree covering". Tree covering methods use fast tree pattern matching techniques and dynamic programming techniques to enumerate efficiently all possible tree coverings for a given boolean network.

Tree covering techniques are aimed at minimizing the cost of the design, in terms of circuit size and propagation delay.

Tree covering solves the following problem: Given a tree T and a set of tree patterns P, representing the gates of a library, and a cost associated with each gate (time and area), find a cover of the tree T of minimum cost. The cover is made out of one or more tree patterns covering the tree T. Each pattern corresponds to a gate in the library.

For example, referring now to FIG. 1A and FIG. 1B, circuit 10 may be minimized using tree covering techniques as follows. A group of gates 11, comprising NAND gate 12, and inverters 13 and 14 are mapped to OR gate 11', as shown in FIG. 1B. Similarly, the group of gates 15, comprising inverters 16 and 17 is replaced by a wire, 15' as shown in FIG. 1B. When used to minimize circuit area, tree covering would select the combinational circuit 18.

Gate selection and gate sizing are performed during tree covering using dynamic programming. Dynamic programming is well known to one skilled in the art, and basically is a technique of solving optimization problems by combining the optimal solutions of sub-problems. Dynamic programming techniques are useful when the sub-problems are not independent, that is when each sub-problem share other sub-sub-problems. Dynamic programming algorithms solve each sub-sub-problem once, and save the result in a table, thereby avoiding the work of recomputing the answer every time the sub-sub-problem is encountered.

Dynamic programming techniques can be used by logic synthesis tools to select an appropriate gate size for each gate in the circuit. Although the logical function of the gate does not change, the transistor sizes of the gates are dictated by the capacitive load and timing constraints of nets driven by the gate. When building a circuit using logic synthesis, the network is generally analyzed in order from inputs to outputs. Because the circuit is analyzed in order from inputs to outputs, the capacitive load to be driven by each gate is not known until the analysis is complete. Using dynamic programming techniques, a number of appropriate gate sizes for each gate in the circuit are provided as the solution set for the gate. Once the analysis of the circuit is completed, the capacitive load for each gate is known, and the appropriately sized gate is selected from the solution set for the gate.

Gate selection and fanout optimization are typically performed one after the other in successive passes over the boolean network. A circuit, whether derived manually or synthesized, is analyzed by an automated process which provides the fanout networks where necessary. A fanout network may be necessary where the loading on a gate is so large that the largest size gate which performs the function cannot drive the associated loads within the desired time constraints.

One aspect of the present invention is the use of fanout networks of fixed topology, made of simple chains of inverters. This topology is shown in FIG. 2. The present invention uses fanout chains such as fanout chain 30, made of four inverters: 32, 34, 36 and 38. Because the fanout chain of FIG. 2 has a simple topology, area and routing costs are minimized. The simple chain of inverters 30 simplifies routing and lowers the routing capacitances, thereby reducing the propagation delay through the fanout network 30. Thus there are two benefits associated with the use of a simple inverter chain topology as shown in the fanout chain: first the fanout network has a smaller area, and second the routing capacitances are reduced.

The number of inverters to be provided in the fanout chain may vary according to the timing considerations and library characteristics of the given design. In this embodiment, using a high performance CMOS library, four inverters were found to allow for the timing considerations to be satisfied, provide a small area fanout network, and reduce the time necessary for computation.

Inverters 32, 34, 36, and 38 are selected from a high-performance CMOS library of gates. The range and number of available inverters, in terms of input capacitance and output drive, is large enough to provide essentially a continuous range of inverters.

A gate may have to drive a plurality of loads, as illustrated in FIG. 3A, where gate 20 drives loads L1 through L9. Each load Li requires the signal from gate 20 at or earlier than a specific time Ri, and each load may have either a positive or negative polarity with respect to the output of gate 20. The polarity of each load is represented by a '+' sign or a '−' sign in FIG. 3A.

The loads Li are assigned to nets in the fanout buffer chain 30 in order of increasing required times Ri. A load can only be assigned to a net of the same polarity. Because of the polarity constraint, there are at most two locations in the fanout chain 30 to which a load may be assigned. Moreover loads are assigned to gates in order of increasing required times. Thus if there are p loads of positive polarity and q loads of negative polarity, there are p×q possible loads assignments. All these assignments are tried, and the one leading to the best fanout network is accepted.

Figure 3B:
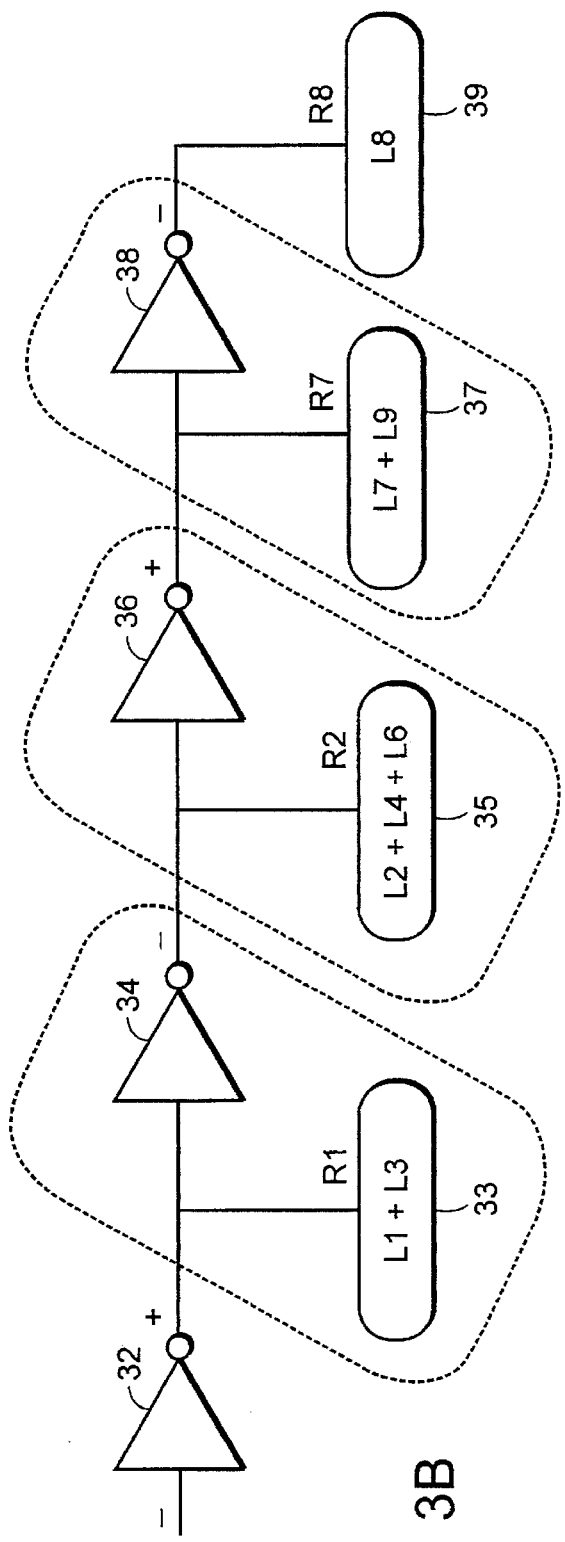
FIG. 3B illustrates the use of the series chain of inverters of FIG. 2 to drive the series of loads of FIG. 3A.

FIG. 3B illustrates one possible assignment pattern for the loads L1 through L9 to the fanout chain of FIG. 2. Once the loads have been selected for evaluation, the group of loads in each section of the fanout chain are combined into aggregate loads. The capacitance of an aggregate load is the sum of the capacitances of the loads combined to form the aggregate load. The required time of an aggregate load is the minimum required time of the loads which are combined to form the aggregate load. For example, the required time of aggregate load 33, driven by inverter 32, is the required time R1. The required time of aggregate load 35, comprising loads L2, L4 and L6, is the required time R2.

Once the loads are assigned and the aggregate loads are computed, the optimal inverter sizes are determined for each buffer in the fanout chain. To determine the appropriate buffer size, the input and output capacitances for each buffer in the chain are determined as follows.

The capacitance of each of the aggregate loads (for example, aggregate load 33), is combined with the input capacitance of the subsequent inverter in the chain (for example, inverter 34) to give the capacitance value to be driven by each inverter in the buffer chain (in this example, buffer 32). Each inverter in the fanout buffer chain drives one total load (the total loads indicated by dashed lines in FIG. 3B), which includes the capacitance of the aggregate load and the input capacitance of the next inverter in the chain.

With such an arrangement the fanout network can be seen as a tree. Thus the tree covering techniques and dynamic programming techniques previously described can be used to provide the optimized fanout network.

Figure 4:
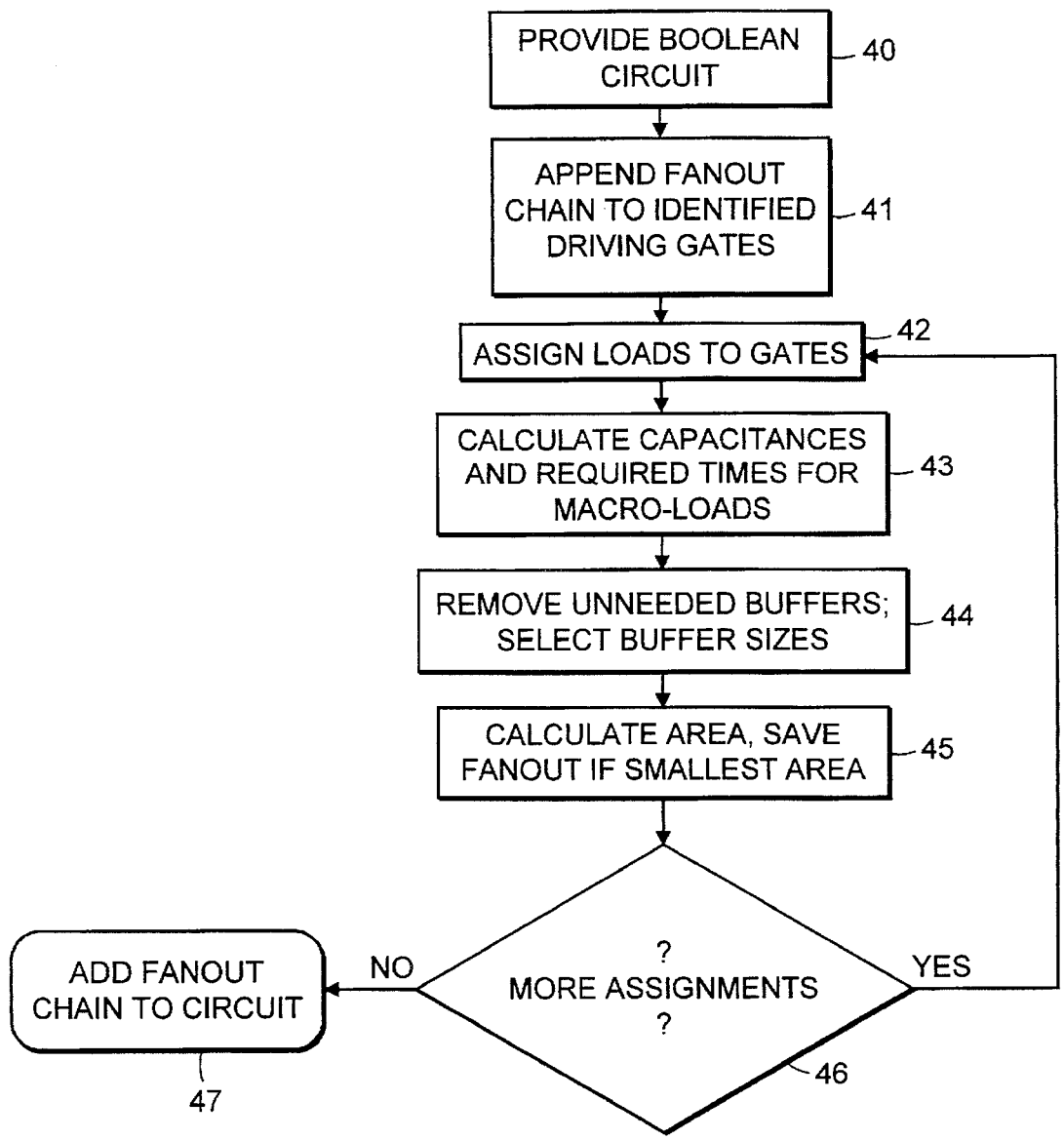
FIG. 4 is a flow diagram illustrating a method of selecting the inverters of FIG. 3B.

FIG. 4 illustrates the computation flow used in the preferred embodiment of the present invention. At step 40, a boolean circuit is provided. The boolean circuit is searched for gates that require fanout networks to satisfy timing constraints. At step 41, a fanout chain (such as that of FIG. 2) is appended as necessary to a number of driving gates in the boolean circuit. At step 42, a possible load assignment pattern is selected. Each load assignment pattern is selected using two criteria: each load is driven by an inverter that provides the correct signal polarity, and the assignment of loads for each polarity is performed in order of increasing required times. Due to the fixed topology of the series coupled inverters, one goal of the load assignment is to place all loads as far away from the source gate as possible to thereby provide a minimal area fanout network. However, certain loads are assigned to an earlier portion of the inverter chain to meet timing constraints.

At step 43, the aggregate load capacitance values for the load assignment pattern selected in step 42 are calculated. The capacitance information is used at step 44 by the above described tree covering and dynamic programming techniques to provide a fanout network.

Depending on the arrangement of loads in the assignment pattern, the loads may be assigned such that a series pair of inverters of the fanout chain 30 drives no loads. As a result, if the series of inverters is not required to satisfy minimum timing constraints of subsequent loads, the tree-covering method removes the series pair of inverters from the fanout chain. In that case a minimal area fanout network including only two inverters would be generated. The method according to this invention uses tree covering in conjunction with dynamic programming to minimize the total area of the inverters in the fanout chain. Tree covering and dynamic programming are used concurrently to select the number and size of each buffer of the fanout chain to provide a fanout chain which satisfies the given fanout requirements.

At step 45, the area of the fanout network is calculated. Fanout networks that do not meet the timing requirements are discarded. If the calculated fanout network is the smallest provided for the driving gate so far, it is saved as the optimized fanout network for the driving gate. If not, it is discarded. At step 46, it is determined if there are any load assignment patterns for each driving gate which have not yet been analyzed. If some load assignment patterns remain to be tested, the process returns to step 42, and selects the next pattern. If not, at step 47, the process is completed, and the optimized fanout networks are coupled to the respective driving gates and corresponding loads in the boolean circuit.

The method described above uses an efficient and effective method to provide a fanout network that occupies a minimal area and satisfies the timing constraints of each coupled load. Due to the simple topology of a series of inverters, the runtime of the process is low, and routing is simplified, thereby reducing the propagation delay through the fanout network in the actual circuit.

Having described a preferred embodiment of the invention, it will now become apparent to one of skill in the art that other embodiments incorporating its concepts may be used. It is felt, therefore, that this embodiment should not be limited to the disclosed embodiment, but rather should be limited only by the spirit and scope of the appended claims.

What we claim is:

1. A method for providing a fanout network to drive a plurality of signals in an integrated circuit, each of said signals driving a plurality of loads, said method comprising the steps of:

coupling, to each one of said signals, a fixed number of a plurality of series coupled inverters;

at each signal, assigning each one said associated plurality of loads be coupled to an output of one of said plurality of inverters; and mapping each of said plurality of inverters to a gate in a library of gates to provide a fanout network.

2. The method according to claim 1, further comprising the steps of:

calculating the area of said fanout network;

determining a propagation delay through said fanout network;

comparing said area against the area of a stored fanout network;

replacing said stored fanout network with said fanout network if said propagation delay of said fanout network is less than or equal to a predetermined delay and if said area of said fanout network is less than the area of said stored fanout network;

repeating said steps of assigning, mapping, determining, calculating, comparing and replacing for a predetermined plurality of assignments.

3. The method according to claim 1, wherein said step of assigning each of said plurality of loads further comprises the steps of:

determining the required time for each of said loads; and ordering said plurality of loads in an order of successively increasing required times.

4. The method according to claim 1, wherein said step of assigning each of said plurality of loads further comprises the steps of:

determining the signal polarity of each load; and assigning each of said loads to one of said plurality of coupled inverters providing said signal polarity.

5. The method according to claim 1, wherein said step of mapping further comprises steps of:

determining the input capacitance of the first inverter of said plurality of series coupled inverters;

allocating a plurality of alternative gate types for said inverter, each alternative capable of providing a corresponding plurality of output drive;

repeating said steps of determining the input capacitance and providing a plurality of alternative gates for each inverter in said plurality of series coupled inverters;

evaluating the output drive driven of the last inverter of said plurality of series coupled inverters; and selecting, for each gate, a gate type from said plurality of alternative gates responsive to the output drive of each gate.

* * * * *